United States Patent
Zang et al.

(10) Patent No.: US 9,036,668 B2
(45) Date of Patent: May 19, 2015

(54) GRATING EXTERNAL-CAVITY SEMICONDUCTOR LASER AND QUASI-SYNCHRONOUS TUNING METHOD THEREOF

(75) Inventors: Erjun Zang, Beijing (CN); Jianping Cao, Beijing (CN); Ye Li, Beijing (CN); Zhanjun Fang, Beijing (CN)

(73) Assignee: NATIONAL INSTITUTE OF METROLOGY P.R. CHINA, Beijing (CN)

( * ) Notice: Subject to any disclaimer, the term of this patent is extended or adjusted under 35 U.S.C. 154(b) by 0 days.

(21) Appl. No.: 12/990,594

(22) PCT Filed: Jun. 10, 2009

(86) PCT No.: PCT/CN2009/000642

§ 371 (c)(1),
(2), (4) Date: Dec. 13, 2010

(87) PCT Pub. No.: WO2009/152690

PCT Pub. Date: Dec. 23, 2009

(65) Prior Publication Data

US 2011/0261843 A1    Oct. 27, 2011

(30) Foreign Application Priority Data

Jun. 18, 2008  (CN) .......................... 2008 1 0127037
Jul. 14, 2008  (CN) .......................... 2008 1 0116638

(51) Int. Cl.
*H01S 3/098*   (2006.01)
*H01S 3/086*   (2006.01)
(Continued)

(52) U.S. Cl.
CPC  . *H01S 5/06* (2013.01); *H01S 5/141* (2013.01); *H01S 5/143* (2013.01); *H01S 3/1055* (2013.01); *H01S 5/02248* (2013.01)

(58) Field of Classification Search
USPC ........................................ 372/18, 19, 20, 102
See application file for complete search history.

(56) References Cited

U.S. PATENT DOCUMENTS 5,058,124 A  * 10/1991  Cameron et al. .............. 372/107
5,255,273 A  * 10/1993  Nilsson et al. .................. 372/20
(Continued)

FOREIGN PATENT DOCUMENTS

CN        101582561 A     11/2009
DE        296 06 494 U1    6/1997

OTHER PUBLICATIONS

International Search Report from P.R. China in International Application PCT/CN2009/000642, mailed Sep. 3, 2009.
(Continued)

*Primary Examiner* — Tod T Van Roy
*Assistant Examiner* — Marcia Golub-Miller
(74) *Attorney, Agent, or Firm* — Finnegan, Henderson, Farabow, Garrett & Dunner, L.L.P.

(57) ABSTRACT

A method for quasi-synchronous tuning of wavelength or frequency of grating external-cavity semiconductor laser and a corresponding semiconductor laser are provided. A grating or mirror is rotated around a quasi-synchronous tuning point (Pq) as rotation center, so as to achieve the frequency selections by grating and resonance cavity in quasi-synchronous tuning, wherein the angle of the line between the quasi-synchronous tuning point (Pq) and a conventional synchronous tuning point (P0) with respect to the direction of light incident on the grating is determined according to the angle difference between the incidence angle and diffraction angle of light on the grating. According to present invention, approximately synchronous tuning of laser is achieved with a simple and flexible design.

2 Claims, 16 Drawing Sheets

(51) Int. Cl.
  *H01S 5/06* (2006.01)
  *H01S 5/14* (2006.01)
  *H01S 3/1055* (2006.01)
  *H01S 5/022* (2006.01)

(56) References Cited

U.S. PATENT DOCUMENTS

| | | | |
|---|---|---|---|
| 5,867,512 A * | 2/1999 | Sacher | 372/20 |
| 6,018,535 A | 1/2000 | Maeda | |
| 6,026,100 A | 2/2000 | Maeda | |
| 6,324,193 B1 * | 11/2001 | Bourzeix et al. | 372/20 |
| 6,778,564 B2 | 8/2004 | Funakawa | |
| 6,850,545 B2 | 2/2005 | Asami | |
| 2007/0223554 A1 | 9/2007 | Hunter et al. | |

OTHER PUBLICATIONS

McNicholl et al., "Synchronous cavity mode and feedback wavelength scanning in dye laser oscillators with gratings," *Applied Optics*, vol. 24, No. 17, pp. 2757-2761 (Sep. 1, 1985).

* cited by examiner

GRATING EXTERNAL-CAVITY SEMICONDUCTOR LASER AND QUASI-SYNCHRONOUS TUNING METHOD THEREOF

CROSS REFERENCE TO RELATED APPLICATIONS

This application is a National Phase Application of International Application Number PCT/CN2009/000642, filed Jun. 10, 2009, and claims the benefit of priority of Chinese Patent App. Nos. 200810127037.5 and 200810116638.6 filed Jun. 18, 2008 and Jul. 14, 2008; respectively, the contents of all of which are incorporated herein by reference in their entirety.

TECHNICAL FIELD

The present invention relates to wavelength and frequency tuning of grating external-cavity semiconductor lasers, wherein quasi-synchronous tuning is achieved by selecting tuning rotation center of the grating or mirror.

BACKGROUND

In the use of external-cavity semiconductor laser (ECDL), there usually needs to tune the wavelength or frequency of generated laser and such tuning is realized by rotating grating to vary the incidence angle and diffraction angle of light on the grating, or by rotating mirror to vary the diffraction angle of light on the grating.

FIGS. 1, 2 and 3 show three types of grating external-cavity semiconductor lasers respectively. Wherein, FIG. 1 shows a conventional external-cavity semiconductor laser in a grazing-incidence configuration (i.e. the incidence angle is larger than the diffraction angle), also known as Littman configuration; FIG. 2 shows a novel external-cavity semiconductor laser in a grazing-diffraction configuration (i.e. the diffraction angle is larger than the incidence angle) proposed by the same applicant in Chinese patent application No. 200810097085.4; and FIG. 3 shows a conventional external-cavity semiconductor laser in Littrow configuration, in which there has no mirror and thus tuning is done only by rotating the grating.

As shown in FIGS. 1-3, the semiconductor laser diode is denoted as LD, the aspheric collimating lens is denoted as AL, the grating is denoted as G, the feedback mirror is denoted as M, the normal of the grating is denoted as N, the incidence angle of light on the grating is denoted as $\theta_i$, the diffraction angle of light on the grating is denoted as $\theta_d$, the difference between the incidence angle and the diffraction angle is $\Delta\theta$, that is, $\Delta\theta=\theta_i-\theta_d$, and $\Delta x$ is the optical path increment generated by the optical elements in the cavity (e.g. the gain media of the aspheric collimating lens and the LD).

In the grazing-incidence configuration shown in FIG. 1 and the grazing-diffraction configuration shown in FIG. 2, a laser beam emitted from the laser diode is incident on the diffraction grating G after the collimation of the aspheric collimating lens AL. The first-order diffracting light from the grating G is normally incident on the feedback mirror M, which, after the reflection of the feedback mirror M, is re-diffracted by the grating along the path collinear with the incident light and in the opposite direction of the incident light, and then returns to the laser diode through the aspheric collimating lens AL following the original optical path.

In the Littrow configuration shown in FIG. 3, a laser beam emitted from the laser diode is incident on the diffraction grating G after the collimation of the aspheric collimating lens AL. The first-order diffracting light from the grating G directly returns to the semiconductor laser diode through the aspheric collimating lens AL along the path collinear with the incident light and in the opposite direction of the incident light following the original optical path. It can be seen that, in the Littrow configuration, the incidence angle is equal to the diffraction angle of light on the grating, that is, $\theta_i=\theta_d=\theta$, and thus $\Delta\theta=0$.

In order to illustrate the tuning principle of external-cavity semiconductor lasers, a Cartesian coordinate system xOy is introduced in the figures, wherein the point O represents the intersection point of a laser beam emitted from semiconductor laser diode LD and the diffraction surface of grating G in its original position; the x-axis runs through the point O and its direction is collinear with and opposite to that of the light emitted from LD; and the y-axis runs through the point O upward and is perpendicular to the x-axis.

The three planes of the equivalent LD rear facet, the diffraction surface of the grating G and the reflection surface of the mirror M are all perpendicular to the xOy coordination plane. The intersection line of the plane on which the diffraction surface of the grating lies and the xOy coordination plane is represented as SG, and the point O is on the intersection line; the intersection line of the plane on which the equivalent LD rear facet lies and the xOy coordination plane is represented as SL, which is separated from the point O at a distance l1; and the intersection line of the plane on which the reflection surface of the feedback mirror M lies and the xOy coordination plane is represented as SM, which is separated from the point O at a distance l2.

In the grazing-incidence configuration shown in FIG. 1 and grazing-diffraction configuration shown in FIG. 2, the optical distance between the point O and the equivalent LD rear facet and the optical distance between the point O and the feedback mirror M, i.e. the lengths of the two sub-cavities of the grating-external cavity, are represented as l1 and l2 respectively, and the whole length of the optical cavity of the semiconductor laser is represented as the sum of them, i.e. l=l1+l2. In the Littrow configuration shown in FIG. 3, the actual optical cavity length of the laser is l1, that is, the distance between the point O and the equivalent LD rear facet.

When rotating the grating G or the mirror M to perform tuning, the rotational axis is perpendicular to the xOy coordinate plane, and the intersecting point of the rotational axis and the xOy coordinate plane (i.e., a rotation center) is denoted as P(x,y) in FIGS. 1-3. For convenience three distance parameters u, v and w are introduced, wherein u represents the distance between the rotation center P and the intersection line SM; v represents the distance between the rotation center P and the intersection line SG; and w represents the distance between the rotation center P and the intersection line SL. The signs of u, v and w are defined as follows: they are positive when the light and the rotation center are on the same side of the respective plane intersection lines, and they are negative when the light and rotation center are on the opposite sides of the respective plane intersection lines respectively. The distance v or u holds when the grating G or the mirror M is rotated around the point P.

In grating external cavity semiconductor laser, there are two essential factors for laser wavelength or frequency determination:

1. frequency selection determined by the values of incidence angle and diffraction angle of the light on the grating and their variations;

2. frequency selection determined by the values of the cavity length of the equivalent F-P cavity formed by SL, SM and SG and their variations.

During the rotation of the grating or mirror around the rotation center P, both the frequency selection of the grating and the frequency selection of the F-P cavity change. In general, those changes are not synchronous, which will cause mode-hopping of the laser mode, thus will disrupt the continuous tuning of laser frequency, and hence, resulting in a very small continuous tuning range without mode-hopping, e.g., 1 to 2 GHz.

In order to achieve synchronous tuning of laser frequency or wavelength, i.e., achieve a large range of continuous frequency tuning without mode-hopping, the rotation center P of the grating G or the feedback mirror M needs to be selected purposefully.

Assuming the grating or the mirror was rotated by an angle α with respect to its original position, the phase shift W of laser beam after one round trip within the F-P cavity is:

$$\Psi = \Psi_0 + A(\alpha) \cdot [B \cdot \sin\alpha + C \cdot (1-\cos\alpha)] \quad (1)$$

wherein, $\Psi 0$ is the original one round trip phase shift of the beam before the rotation tuning, A(a) is a function of the tuning rotation angle α. $\Psi 0$, B and C are functions that are irrelative to the angle α. $\Psi 0$, A(α), B and C relate to the original parameters of the external-cavity semiconductor laser, including original angles (for example, original incidence angle θi, original diffraction angle θd etc.), original positions (for example, original cavity lengths l1 and l2, and original distances u, v and w), and grating constant d, and the like. When full synchronous tuning conditions are satisfied, the phase shift $\Psi$ should be independent of the rotation angle α, and thus, both B and C in Eq.(1) should be zero.

Here, the distance parameters of the rotation center P0 fulfilling rigorous synchronous tuning should meet:

$$\begin{cases} u0 + w0 = 0 \\ v0 = 0 \end{cases} \quad (2)$$

It is evident that the rotation center P0 satisfying synchronous tuning conditions should lie on the intersection line of the plane on which the grating diffraction surface lies and the xOy coordinate plane; meanwhile, the distance u0 from the rotation center P0 to the plane on which the reflection surface of the mirror lies and the distance w0 from P0 to the plane on which the equivalent LD rear facet lies have the same absolute values and the opposite signs.

For grazing-incidence and grazing-diffraction configuration, the coordinate of the rotation center satisfying synchronous tuning conditions is represented as P0(x0,y0), which meet:

$$\begin{cases} x0 = ld\sin\theta i / \lambda \\ y0 = ld\cos\theta i / \lambda \end{cases} \quad (3)$$

Wherein, x0, y0 are abscissa and ordinate of the synchronous tuning rotation center P0 respectively, l is the equivalent cavity length of the F-P cavity at the original position, d is the grating constant, θi is the incidence angle of the light on the grating, and λ is the laser wavelength.

FIGS. 4 and 5 show the synchronous tuning of grazing-incidence configuration and grazing-diffraction configuration respectively.

FIG. 6 shows the synchronous tuning of the Littrow configuration. Since there has no mirror in the Littrow configuration, which means that u0=w0, the distance parameter constraint conditions defined in Eq.(2) become:

$$\begin{cases} w0 = 0 \\ v0 = 0 \end{cases} \quad (4)$$

That is, the synchronous tuning center P0 should at the intersecting point of the lines SG and SL.

Since θi=θd=θ and the actual optical cavity length is l1 in the Littrow configuration, when expressed by coordinate of P0(x0, y0), the distance parameter constraint conditions defined in Eq.(3) become:

$$\begin{cases} x0 = l1 \\ y0 = \dfrac{l1}{\tan\theta} \end{cases} \quad (5)$$

It can be seen from the above description that, regardless of whether the coordination parameter or the distance parameter is used, the position of the synchronous tuning rotation center P0 needs to be defined by a equation group consisting of two equations, and the above two constraint conditions must be satisfied simultaneously, which means that there needs two adjustment mechanisms with the independent freedoms in the laser design. Despite for the grazing-incidence configuration, the grazing-diffraction configuration or the Littrow configuration, the position of the synchronous tuning rotation center P0 can not leave from the SG plane on which the diffraction surface of the grating lies, which leads to disadvantages and difficulties in configuration design, adjustment and application of laser, while complicates the mechanical system and increases the instable factors.

In practice, a large continuous tuning range without mode-hopping may be affected by many other factors, for example, whether there is a AR(antireflection) coating applied on the LD surface and the quality of coating and the like. However, a continuous frequency tuning range of hundreds or even tens of GHz may be sufficient for many applications.

SUMMARY OF THE INVENTION

The technical problem to be solved by the present invention is to find a method for performing approximately synchronous tuning (quasi-synchronous tuning) of grating external-cavity semiconductor laser, which renders the resultant mode-hopping-free tuning range is almost the same as in rigorous synchronous tuning, while the adjustment mechanism is more stable, reliable and simple, without significantly degrading the quality of the laser. According to the present invention, the technical problem is solved by a method for tuning a grating external-cavity semiconductor laser, wherein a grating or a mirror of the semiconductor laser is rotated around a quasi-synchronous tuning point as rotation center, such that the distance between the plane on which the diffraction surface of the grating lies or the plane on which the reflection surface of the mirror lies and the quasi-synchronous tuning point holds during the rotation, whereby achieving the quasi-synchronous tuning of the frequency selections by the grating and resonance cavity, wherein the quasi-synchronous timing point is determined in the following manner:

determining such a synchronous tuning point that during the rotation of the grating or mirror around the synchronous tuning point, the laser beam round trip phase difference in the resonance cavity of the semiconductor laser holds; the quasi-synchronous tuning point is located on a line passing through the synchronous tuning point, wherein the angle of the line with respect to the direction of the light incident on the grating is determined by the angle difference $\Delta\theta$ between the incidence angle and the diffraction angle of laser beam on the grating, that is, for grating rotation, the angle being $\Delta\theta/2$; and for mirror rotation, the angle being $\Delta\theta$.

According to the present invention, a corresponding external-cavity semiconductor laser is also provided, which comprises a quasi-synchronous tuning mechanism for implementing the abovementioned quasi-synchronous tuning method. The quasi-synchronous tuning mechanism rotates the grating or the mirror around the determined quasi-synchronous tuning rotation center to achieve the quasi-synchronous tuning of frequency selections by the grating and resonance cavity. The external-cavity semiconductor laser may in a Littman configuration or in a grazing-diffraction configuration, as well as a Littrow configuration. In the case of external-cavity semiconductor laser in Littrow configuration, the line from the quasi-synchronous tuning center to the synchronous tuning center is parallel to the direction of the light incident on the grating, since the difference between the incidence angle and the diffraction angle $\Delta\theta=0$.

The present invention is based on the following finds:

In the tuning phase shift described in the above Eq.(1), the tuning rotation angle $\alpha$, when represented in radian, is a small value approximating to zero and far less than 1. According to the Taylor series expansion theorem, it can be known that, the first item $\sin\alpha$ in the square brackets of Eq.(1) is the odd high-order item beginning from the first-order item of the tuning rotation angle $\alpha$, and the second item $(1-\cos\alpha)$ is even high-order item beginning from the second-order item of the tuning rotation angle $\alpha$, and so the second item $(1-\cos\alpha)$ is a small value higher ordered than $\sin\alpha$ and has far less contribution to the phase shift $\Psi$ than $\sin\alpha$. Hence, by omitting the second-order and higher-order items in Eq.(1), the round trip phase shift $\Psi$ can be approximately represented as:

$$\Psi = \Psi_0 + A(\alpha)\cdot B \cdot \sin\alpha \quad (6)$$

In this case, the coefficient B can be set to 0 in order to make the round trip phase shift q irrelevant to the tuning rotation angle $\alpha$. That is, $$B=0 \quad (7)$$

Such approximation is called quasi-synchronous tuning approximation, under which the frequency tuning of the external-cavity semiconductor laser is a quasi-synchronous tuning, wherein the rotation center of the corresponding grating or mirror is called quasi-synchronous tuning rotation center Pq with coordination Pq(xq,yq). In the range of such approximation, the round trip phase shift caused by the rotation angle $\alpha$ can be omitted, i.e., $\Psi \approx \Psi_0$, which can be approximated as a constant irrelevant to the tuning rotation angle. In practice, almost all the parameters of external-cavity semiconductor laser and tuning range of rotation angle $\alpha$ meet such approximation condition.

By means of the solutions of the present invention, the number of synchronous tuning constraint conditions can be reduced, so that merely one adjustment freedom is required for the adjustment mechanism. The position of the rotation center is no longer limited to the intersection line SG of the plane on which the grating surface lies, thus resulting in more flexible and powerful synchronous tuning, facilitating realization of approximately synchronous rotational frequency or wavelength tuning of the laser.

DETAILED DESCRIPTION OF PREFERRED EMBODIMENTS

FIGS. 7-11 show various embodiments of the determination of the quasi-synchronous tuning rotation center of grating external-cavity semiconductor laser according to the present invention respectively.

Figure 1:
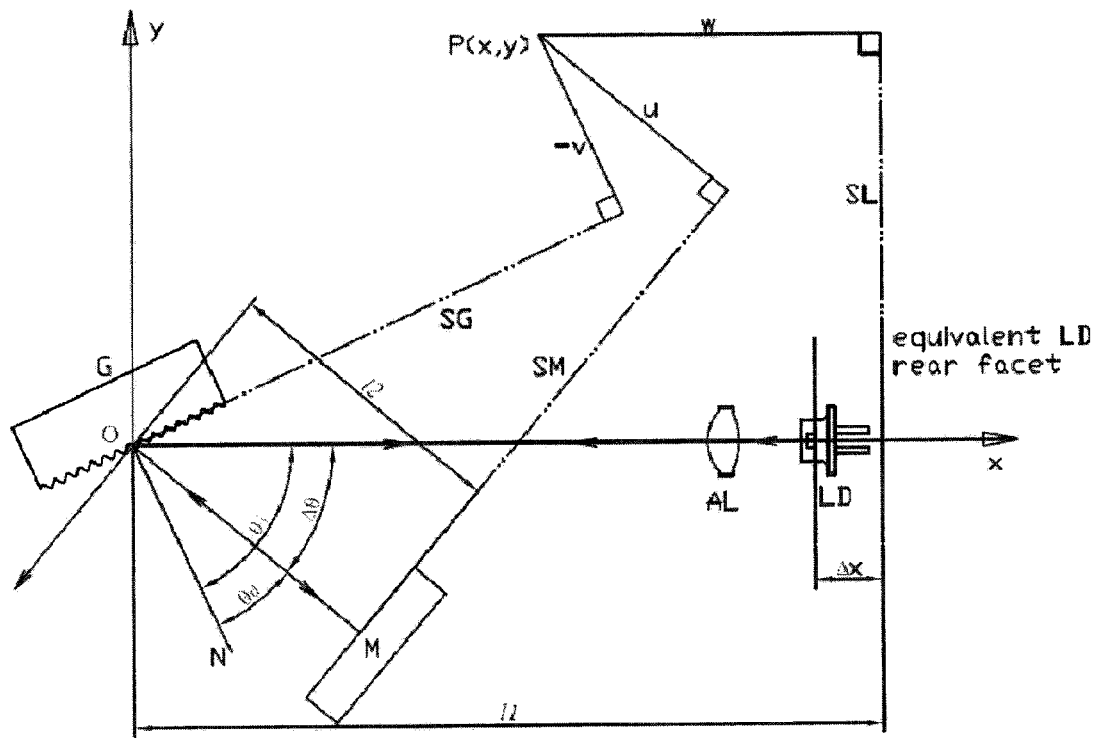
FIG. 1 shows a simplified view of grating external-cavity semiconductor laser in Littman (grazing-incidence) configuration.
Figure 2:
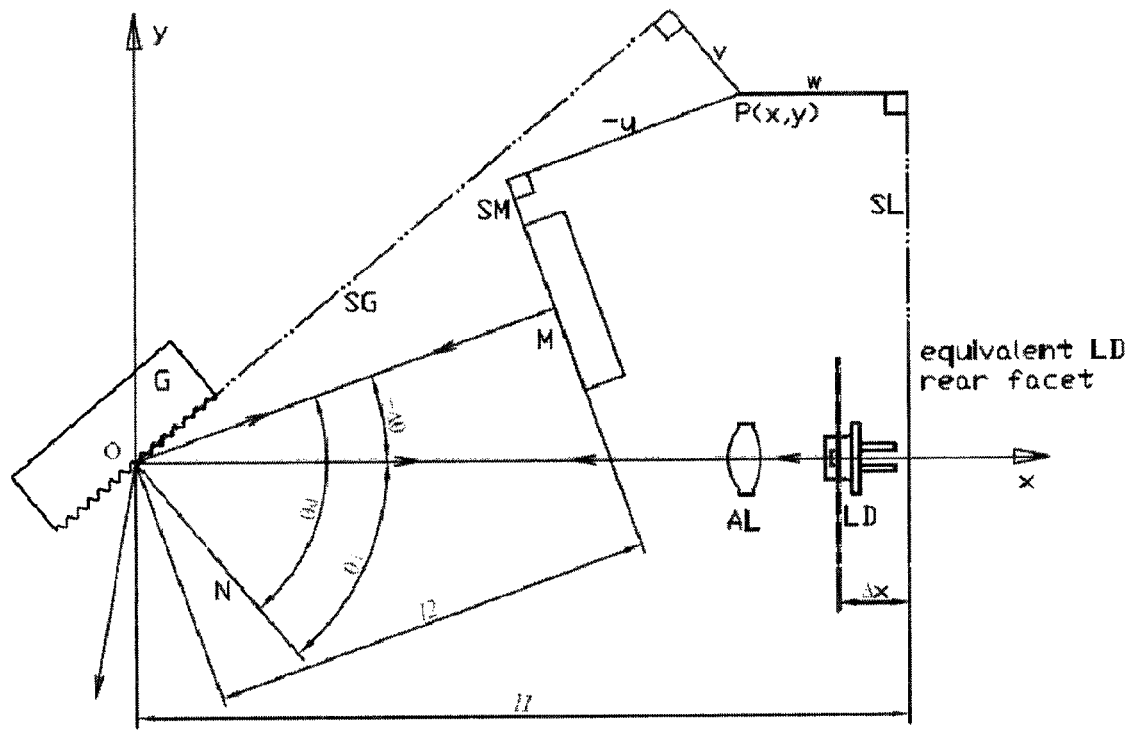
FIG. 2 shows a simplified view of grating external-cavity semiconductor laser in grazing-diffraction configuration.
Figure 3:
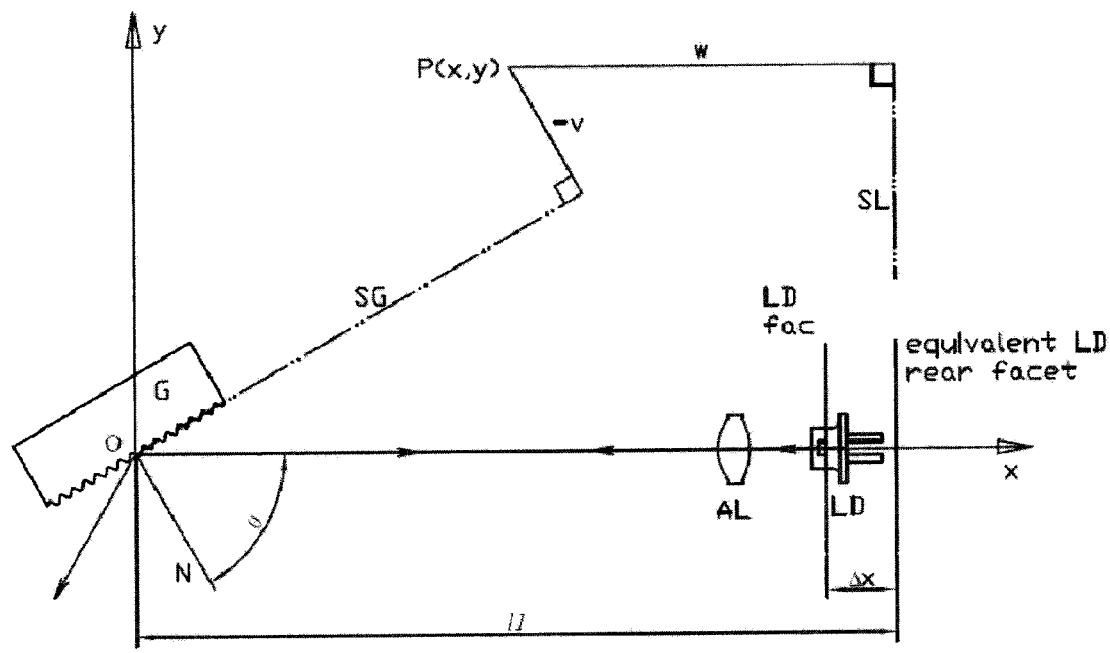
FIG. 3 shows a simplified view of grating external-cavity semiconductor laser in Littrow configuration.
Figure 4:
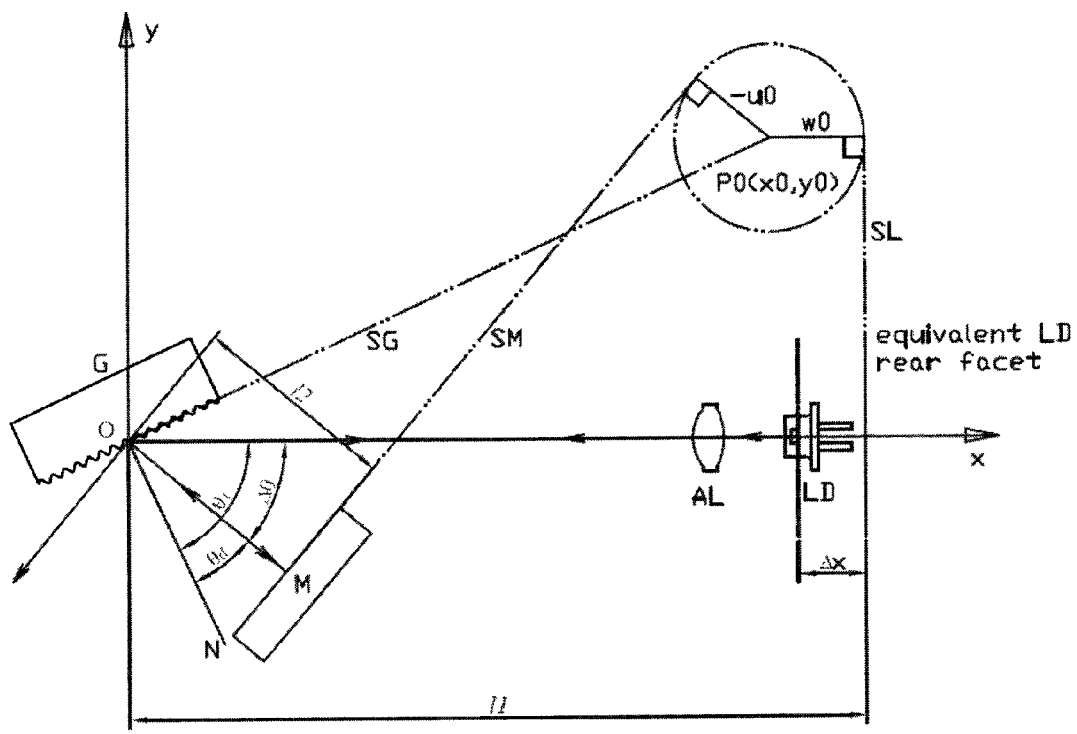
FIG. 4 shows the determination of the conventional synchronous tuning rotation center for Littman configuration.
Figure 5:
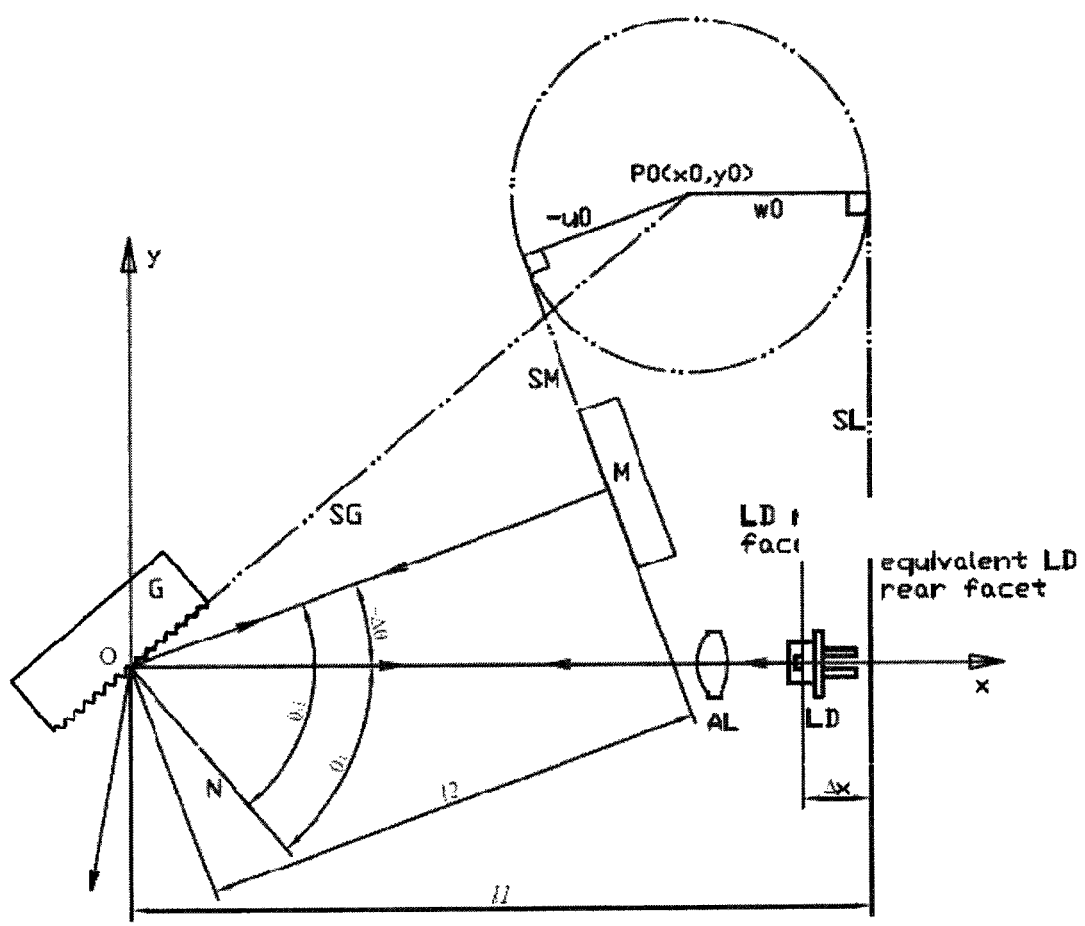
FIG. 5 shows the determination of conventional synchronous tuning rotation center for grazing-diffraction configuration.
Figure 6:
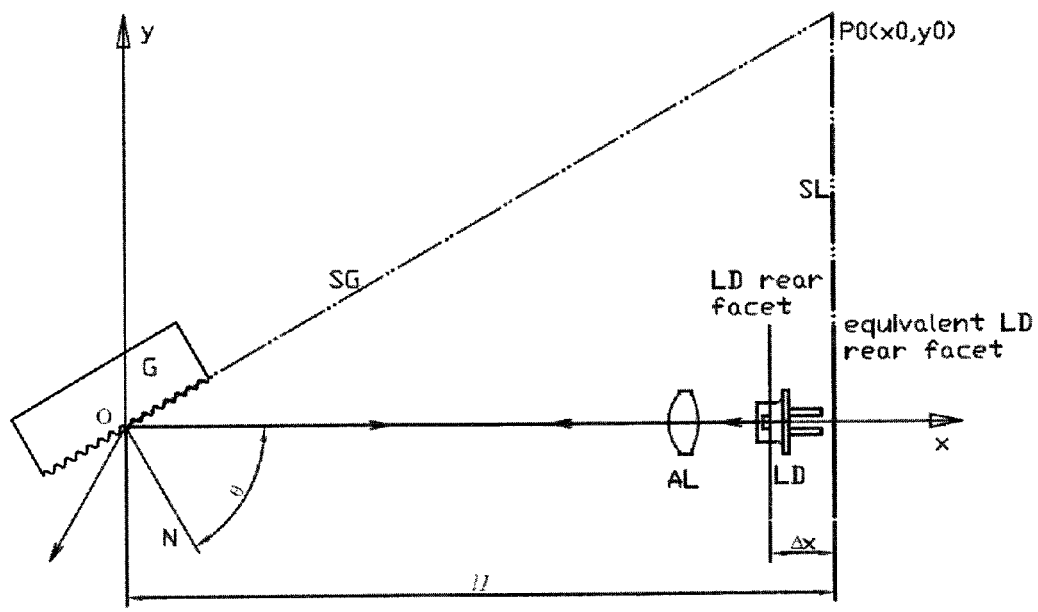
FIG. 6 shows the determination of conventional synchronous tuning rotation center for Littrow configuration.
Figure 7:
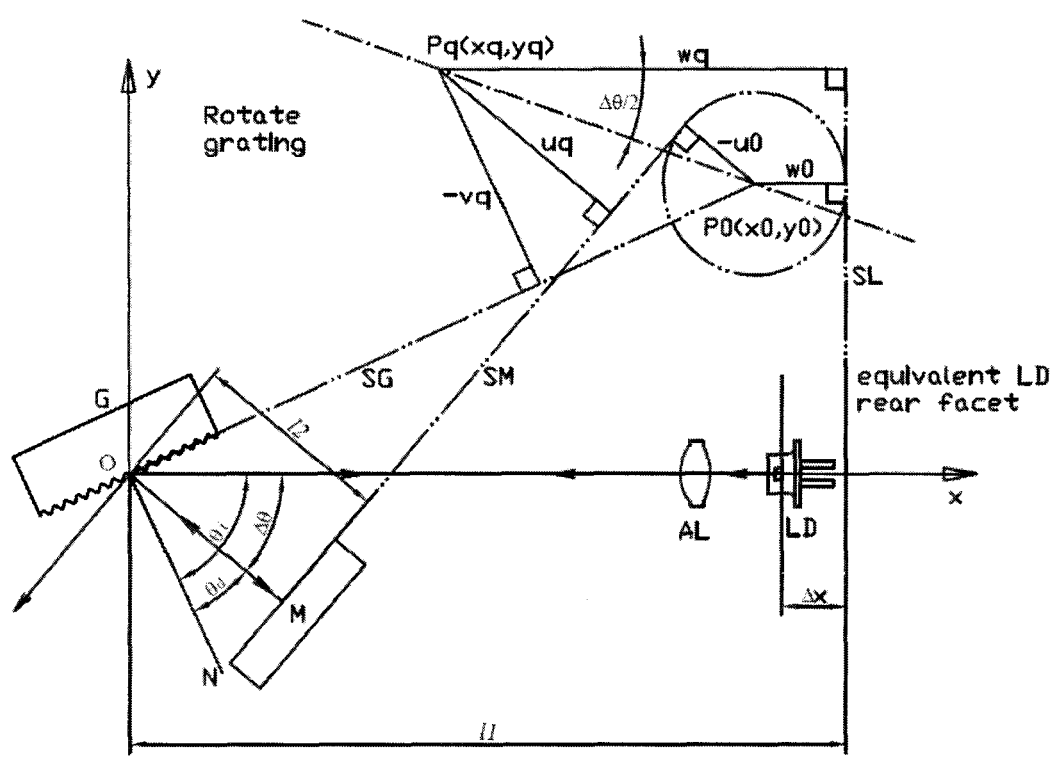
FIG. 7 shows the determination of quasi-synchronous tuning rotation center for Littman configuration in grating rotation tuning according to the present invention.
Figure 8:
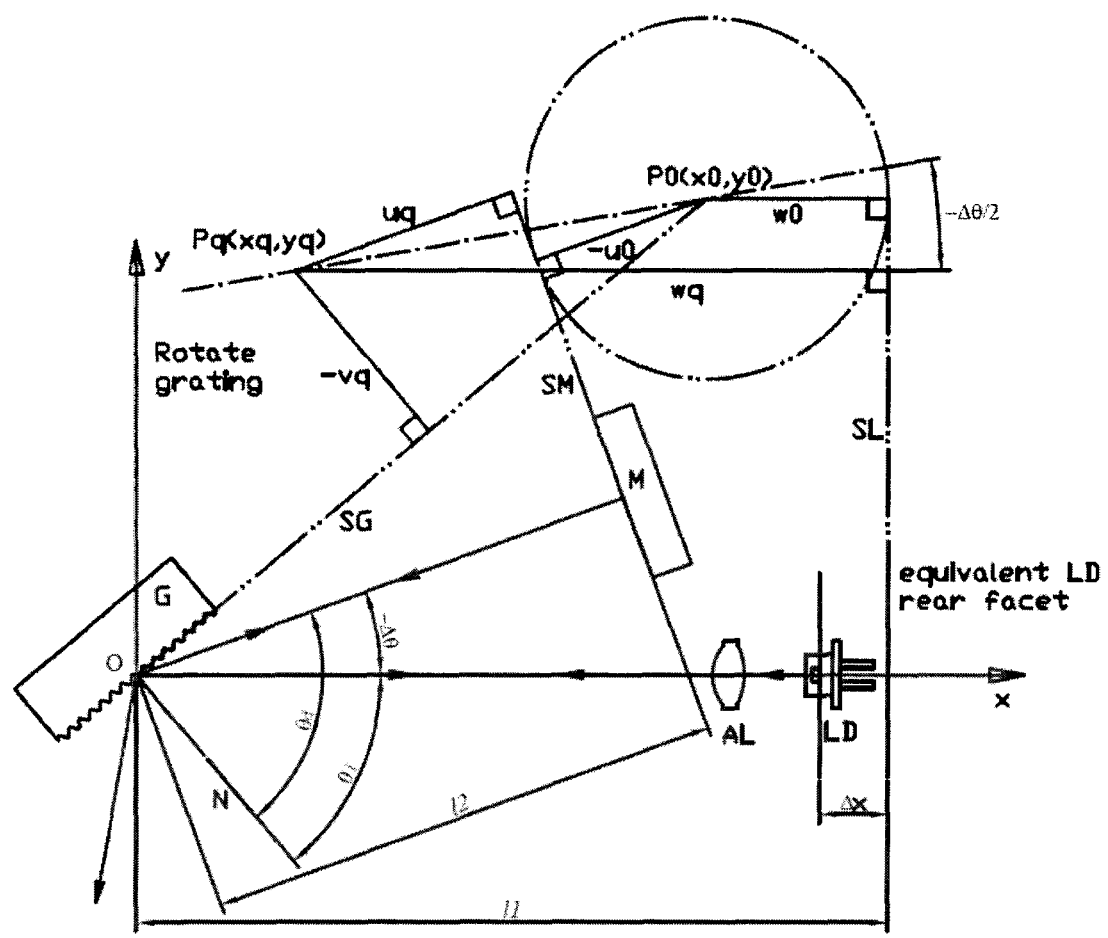
FIG. 8 shows the determination of quasi-synchronous tuning rotation center for grazing-diffraction configuration in grating rotation tuning according to the present invention.

FIGS. 7 and 8 show the cases of rotating the grating to perform tuning, wherein both of the incidence angle $\theta i$ and diffraction angle $\theta d$ of light on the grating G change. For grating external-cavity semiconductor laser in grazing-incidence configuration and grazing-diffraction configuration, when coefficient B in Eq.(6) is zero, quasi-synchronous tuning rotation center Pq(xq, yq) of the grating G satisfies the following condition:

$$yq = y0 = -(xq - x0)\cdot\tan\frac{\Delta\theta}{2} \quad (8)$$

wherein x0 and y0 are the coordinates of synchronous tuning rotation center given by Eq.(3), $\Delta\theta$ is the difference between the incidence angle and the diffraction angle, that is, $\Delta\theta = \theta i - \theta d$. On the xOy plane, the trace of the grating rotation center coordinate Pq(xq, yq) satisfying Eq.(8) is a line passing through synchronous tuning rotation center P0(x0, y0), and the line has a $\Delta\theta/2$ angle with the x-axis in negative direction. If distance parameters uq, vq and wq are used, in the condition of quasi-synchronous tuning, the distance parameters uq, vq and wq satisfy the following equation in grating rotation tuning:

$$(uq+wq)\cdot(\cos\theta i+\cos\theta d)+2\cdot vq\cdot(1+\cos\Delta\theta)=0 \quad (9)$$

Figure 9:
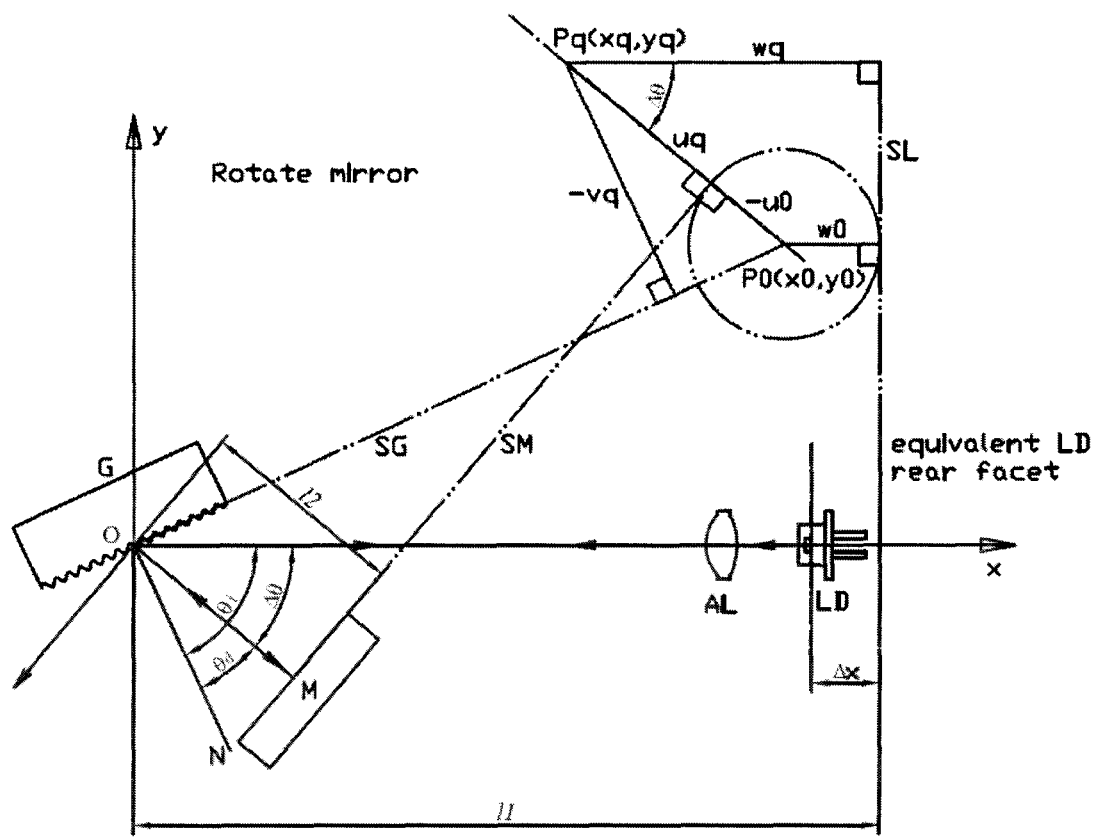
FIG. 9 shows the determination of quasi-synchronous tuning center for Littman configuration in mirror rotation tuning according to the present invention.
Figure 10:
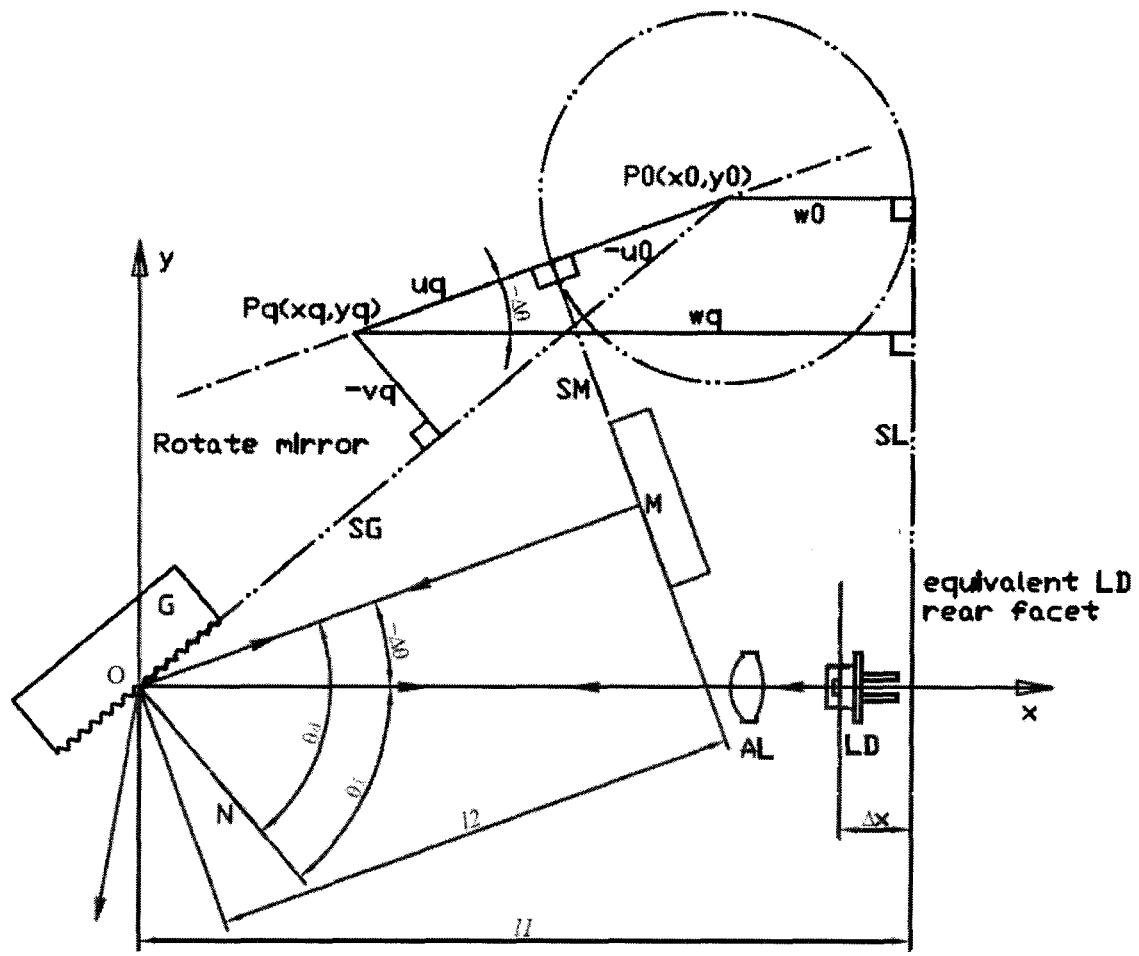
FIG. 10 shows the determination of quasi-synchronous tuning rotation center for grazing-diffraction configuration in mirror rotation tuning according to the present invention.
Figure 11:
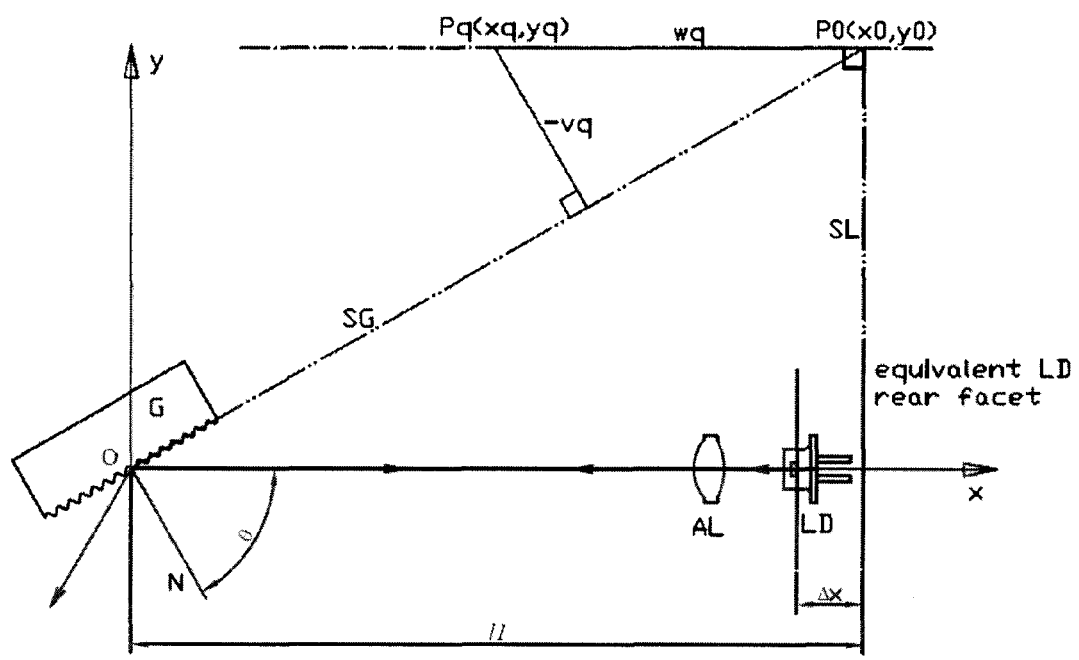
FIG. 11 shows the determination of quasi-synchronous tuning rotation center for Littrow configuration according to the present invention.

FIGS. 9 and 10 show the cases of rotating the mirror to perform tuning, wherein only the diffraction angle $\theta d$ changes and the incidence angle $\theta i$ does not change. For grating external-cavity semiconductor laser in grazing-incidence configuration and grazing-diffraction configuration, when the coefficient B in Eq.(6) is zero, quasi-synchronous tuning rotation center coordinate Pq(xq, yq) of the mirror M satisfies the following condition:

$$yq-y0=-(xq-x0)\cdot\tan\Delta\theta \quad (10)$$

wherein x0 and y0 are the coordinates of synchronous tuning rotation center given by Eq.(3), $\Delta\theta$ is the difference between the incidence angle and the diffraction angle, that is, $\Delta\theta=\theta i-\theta d$. On the xOy plane, the trace of the mirror rotation center coordinate Pq(xq, yq) satisfying Eq.(10) is also a line passing through the synchronous tuning rotation center P0(x0, y0), and the line has a $\Delta\theta$ angle with the x-axis in negative direction. If distance parameters uq, vq and wq are used, in the condition of quasi-synchronous tuning, the distance parameters uq, vq and wq in mirror rotation tuning satisfy:

$$(uq+wq)\cdot\cos\theta d+vq\cdot(1+\cos\Delta\theta)=0 \quad (11)$$

It can be seen from Eq.(8) and Eq.(10) that, when the diffraction angle $\theta d$ equals to the incidence angle $\theta i$, namely, $\theta d=\theta i=\theta$, $\Delta\theta=0$, and quasi-synchronous tuning condition of a Littrow configuration can be obtained, that is:

$$yq=y0 \quad (12)$$

Wherein y0 is the ordinate of the synchronous tuning rotation center P0 given by Eq.(5). On the xOy plane, the trace of quasi-synchronous rotation center coordinate Pq(xq, yq) satisfying the above condition is a line passing through the synchronous tuning rotation center P0(x0, y0) and parallel to the x-axis (see FIG. 11). When distance parameters uq, vq and wq are used, the following equation needs to be satisfied:

$$wq\cdot\cos\theta+vq=0 \quad (13)$$

Here, the signs of the distance parameters uq, vq and wq are specified as positive if the light and quasi-synchronous tuning center Pq are on the same side of the corresponding intersection line of planes, and otherwise, negative.

Thus, from the perspective of actual physical space of laser, on the xOy plane, the rotation center Pq(xq, yq) satisfying the quasi-synchronous tuning condition can be considered as a section extending from the rotation center P0(x0, y0) under the conventional synchronous tuning condition to a line passing through P0(x0, y0) in the proximity of P0, the section can be on either side of P0. For external-cavity semiconductor laser in grazing-incidence configuration and grazing-diffraction configuration, in grating rotation tuning (FIG. 7 and FIG. 8), the line is parallel to the bisector of the angle between normal N of mirror M and the light emitted from the semiconductor laser diode LD; and in mirror rotation tuning (FIG. 9 and FIG. 10), the line is parallel to normal N of mirror M. For external-cavity semiconductor laser in Littrow configuration (FIG. 11) in which the mirror M corresponds to being coincident with the equivalent LD rear facet and the grating G is rotated to perform tuning, the line is parallel to the light emitted from the semiconductor laser diode LD. A large synchronous tuning range notably superior to those of other positions can be obtained along the line determined according to the present invention, and the nearer to the synchronous tuning point P0(x0, y0), the larger synchronous tuning range can be obtained.

Figure 12:
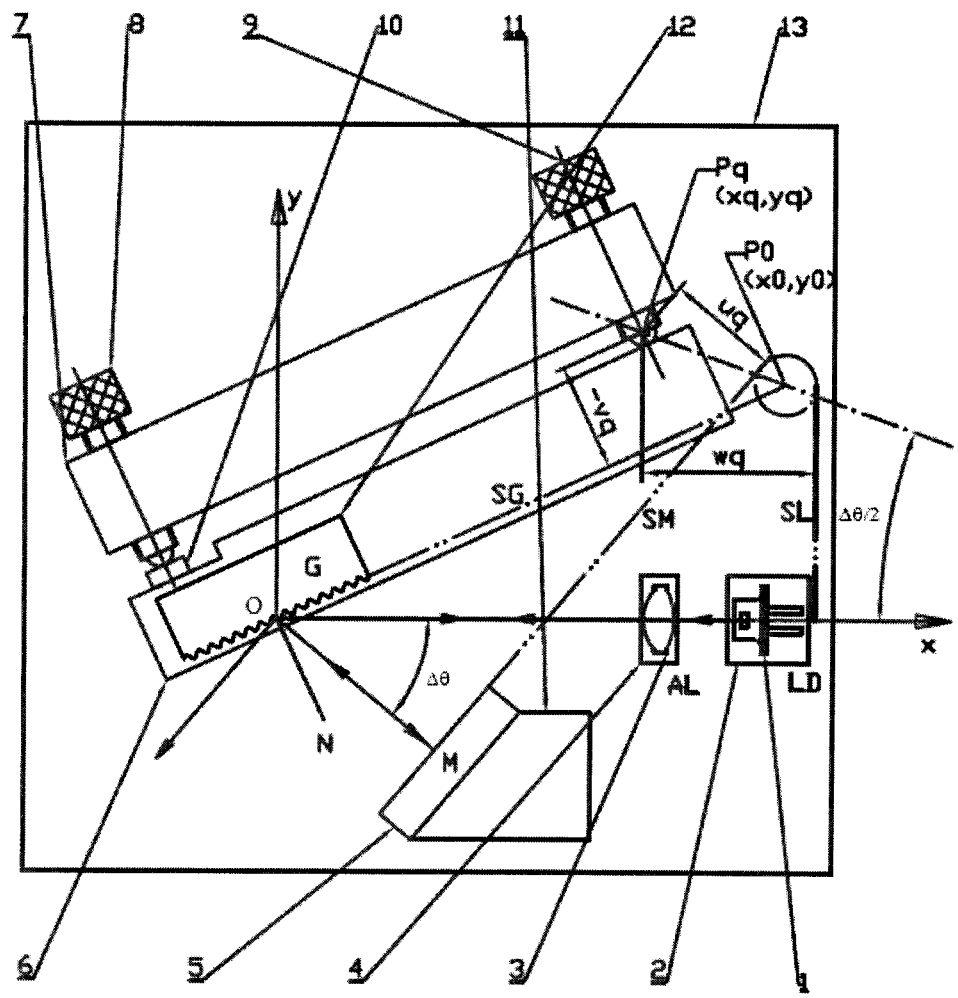
FIG. 12 shows the quasi-synchronous tuning mechanism of grating external-cavity semiconductor laser in Littman configuration in grating rotation tuning.
Figure 13:
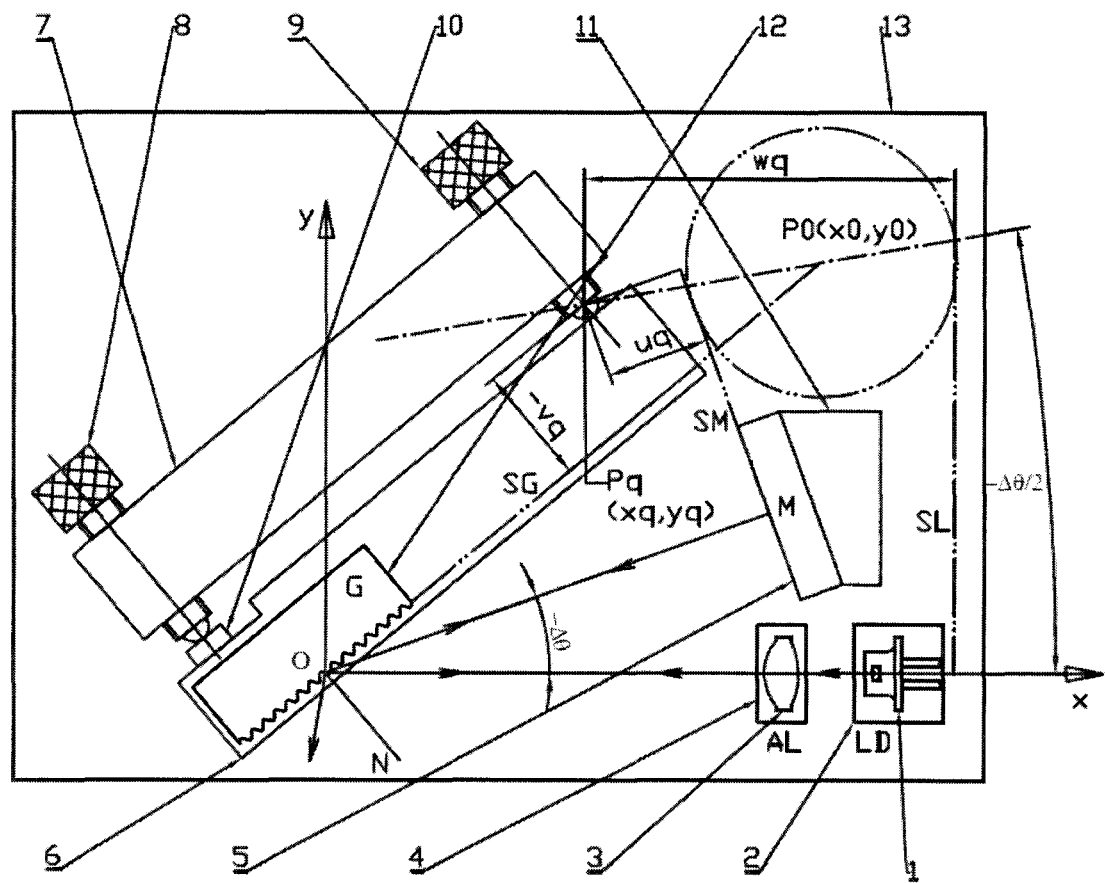
FIG. 13 shows the quasi-synchronous tuning mechanism of grating external-cavity semiconductor laser in grazing-diffraction configuration in grating rotation tuning.

FIGS. 12 and 13 show the quasi-synchronous tuning mechanisms of the external-cavity semiconductor lasers in grazing-incidence configuration and grazing-diffraction configuration in grating rotation tuning respectively.

As shown in FIG. 12, a laser beam emitted by the semiconductor diode LD at wavelength of 689 nm and output power of 30 mW is incident on a holographic diffraction grating G having groove density of 1800 g/mm, grooved area of 12.5 mm*12.5 mm, and thickness of 6 mm, as well as appropriate diffraction efficiency, after being collimated by an aspheric collimating lens AL having focal length of 4 mm and numerical aperture of 0.6, and the zero-order diffraction light or the direct mirror reflection light of the grating G is used as the output light beam of laser. The first-order diffraction light of the grating is normally incident on a planar mirror M, reverses its direction after the reflection of M, and returns to semiconductor diode LD along the path collinear with the original incident beam but in the opposite direction after the re-diffraction of the grating.

The semiconductor diode LD, for example, utilizes temperature sensor and semiconductor cooler to realize temperature control by a heat sink 2. A specific implementation of the quasi-synchronous tuning mechanism will be described below: the collimating lens AL is adjusted and fixed by a lens holder 4, a diffraction grating G is fixed on an adjuster moving plate 6, the direction of the diffraction grating G can be adjusted by adjusting screws 8 and 9 on a adjuster fixed plate 7 and further finely adjusted by a piezoelectric ceramics 10 on the moving plate, and the mirror M is fixed on a base plate 13 by a fixing holder 11. Frequency selections by the external-cavity and the grating are realized by rotating the diffraction grating G around a quasi-synchronous rotation center Pq. For example, a coarse tuning can be made by varying the angle of diffraction grating G by means of adjusting screw 8, and/or a fine tuning can be made by applying a control voltage on the piezoelectric ceramics 10.

In the external-cavity semiconductor laser in Littman configuration shown in FIG. 12, quasi-synchronous tuning rotation center Pq (xq,yq) around which the grating rotates lies on a line passing through the conventional synchronous tuning rotation center P0(x0, y0) and having a $\Delta\theta/2$ angle with the x-axis in the negative direction, herein $\Delta\theta>0$ since $\theta i>\theta d$.

The external-cavity semiconductor laser in grazing-diffraction configuration tuned by grating rotation shown in FIG. 13 is similar to the grazing-incidence configuration of FIG. 12, and the only difference is that the location of mirror M is different, which causing $\theta i<\theta d$, and thus $\Delta\theta<0$. The quasi-synchronous tuning rotation centers Pq (xq,yq) also lies on a line passing through the conventional synchronous tuning rotation center P0(x0, y0) and having a $\Delta\theta/2$ angle with the x-axis in negative direction, but the inclined direction of this line is opposite to that of the line in FIG. 12.

Figure 14:
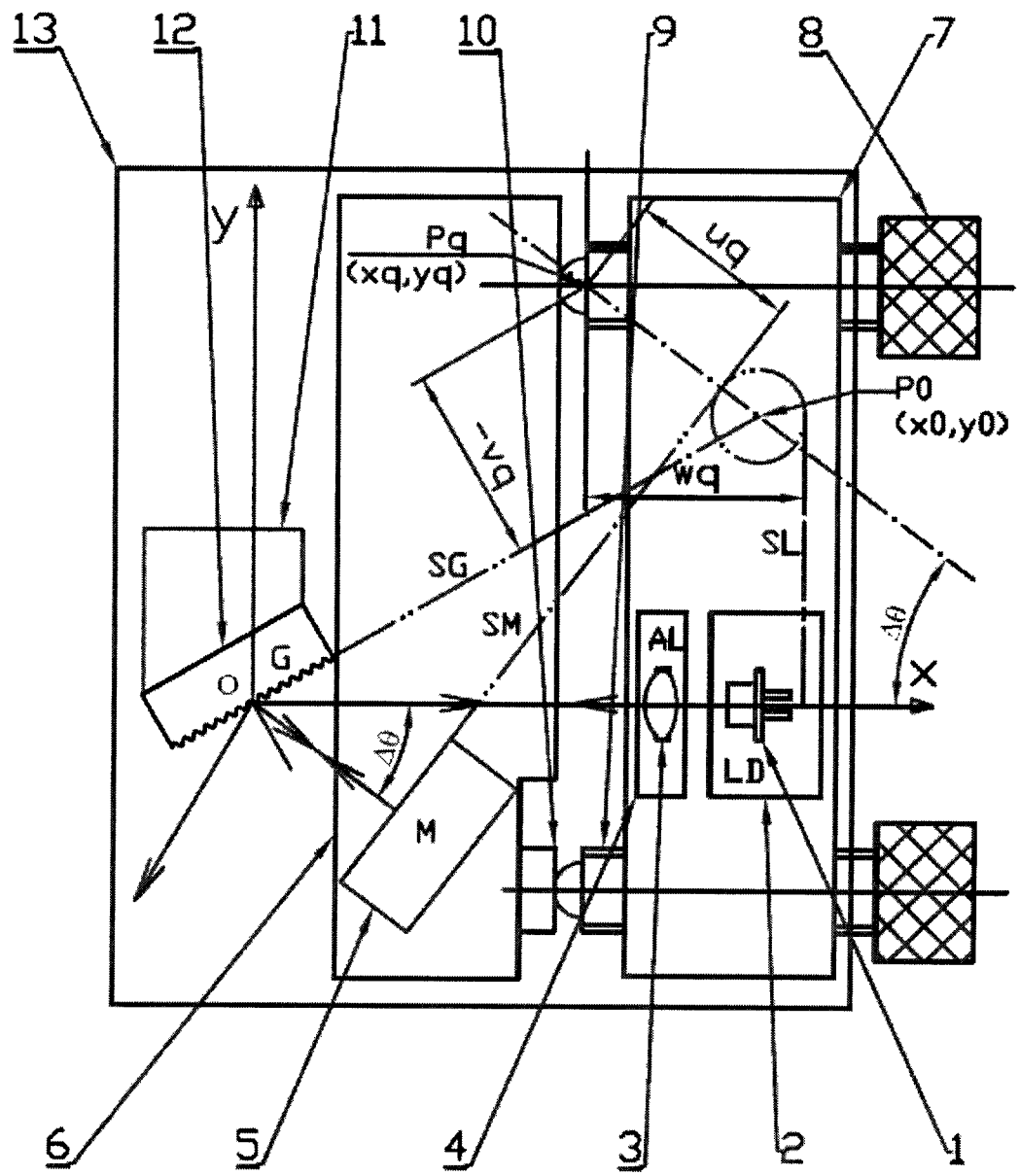
FIG. 14 shows the quasi-synchronous tuning mechanism of grating external-cavity semiconductor laser in Littman configuration in mirror rotation tuning.
Figure 15:
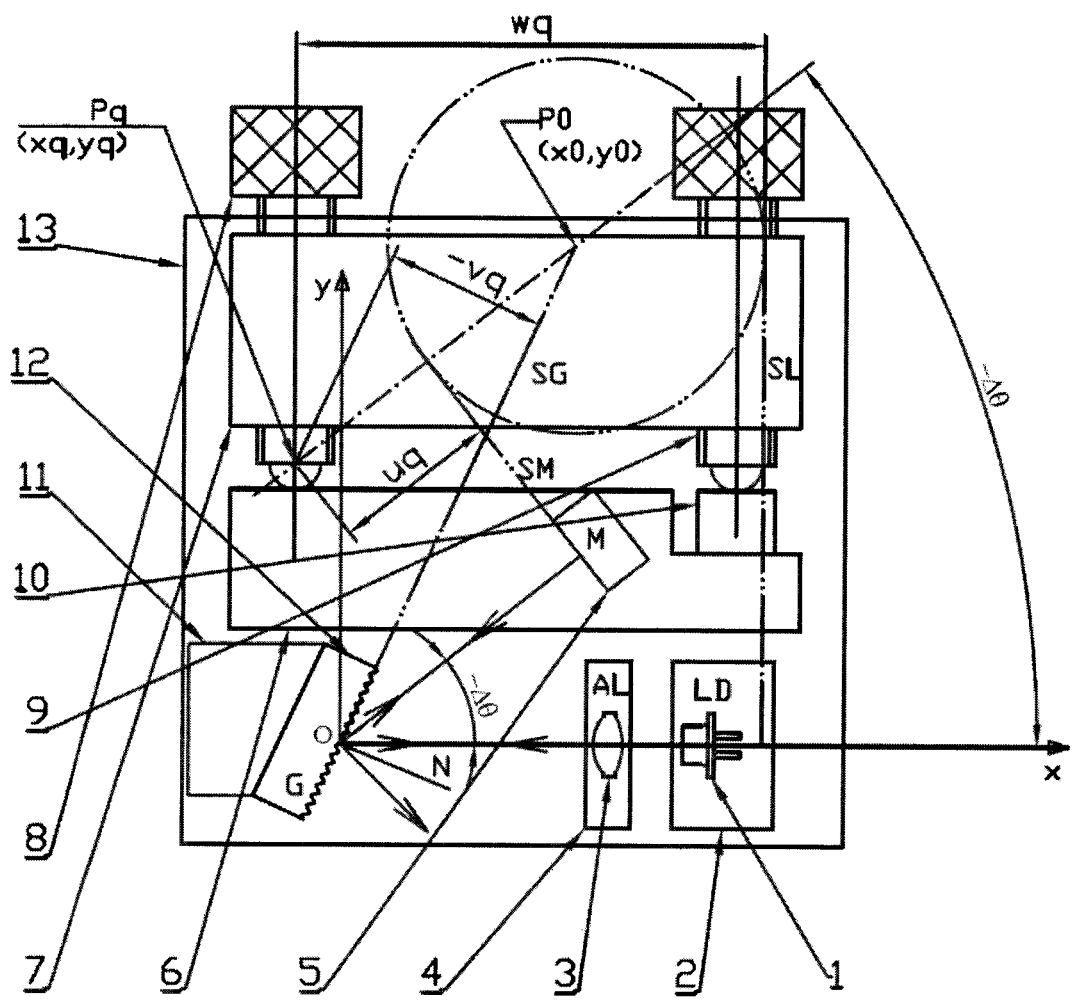
FIG. 15 shows the quasi-synchronous tuning mechanism of grating external-cavity semiconductor laser in grazing-diffraction configuration in mirror rotation tuning.

Similarly, FIGS. 14 and 15 show the quasi-synchronous tuning mechanisms of the external-cavity semiconductor lasers in grazing-incidence configuration and grazing-diffraction configuration in mirror rotation tuning respectively.

In the quasi-synchronous tuning mechanisms shown in FIGS. 14 and 15, a grating G is fixed on a base plate 13 by a fixing holder 11, a mirror M is fixed on an adjuster moving plate 6, the direction of the mirror M can be adjusted by adjusting screws 8 and 9 on an adjuster fixed plate 7 and also finely adjusted by a piezoelectric ceramics 10 on the moving plate. The frequency selections by external-cavity and grating can be realized by rotating the mirror M around a quasi-synchronous tuning rotation center Pq. For example, a coarse tuning can be made by varying the angle of mirror M by means of tuning screw 8, and/or a fine tuning can be made by applying a control voltage on the piezoelectric ceramics 10.

In the external-cavity semiconductor laser in Littman configuration tuned by mirror rotation shown in FIG. 14, the quasi-synchronous tuning rotation center Pq (xq,yq) around which the mirror rotates lies on a line passing through the conventional synchronous tuning rotation center P0(x0, y0) and having an angle $\Delta\theta$ with the x-axis in negative direction, herein $\Delta\theta>0$ since $\theta i>\theta d$.

The external-cavity semiconductor laser in grazing-diffraction configuration quasi-synchronously tuned by mirror rotation shown in FIG. 15 is similar to the grazing-incidence configuration shown in FIG. 14, and the only difference is that the location of mirror M is different, which causing $\theta i<\theta d$, and thus $\Delta\theta<0$. The mirror rotation quasi-synchronous tuning center Pq (xq,yq) also lies on a line passing through the conventional synchronous tuning rotation center P0(x0, y0) and having a $\Delta\theta$ angle with the x-axis in negative direction, but the inclined direction of this line is opposite to that of the line in FIG. 14.

Figure 16:
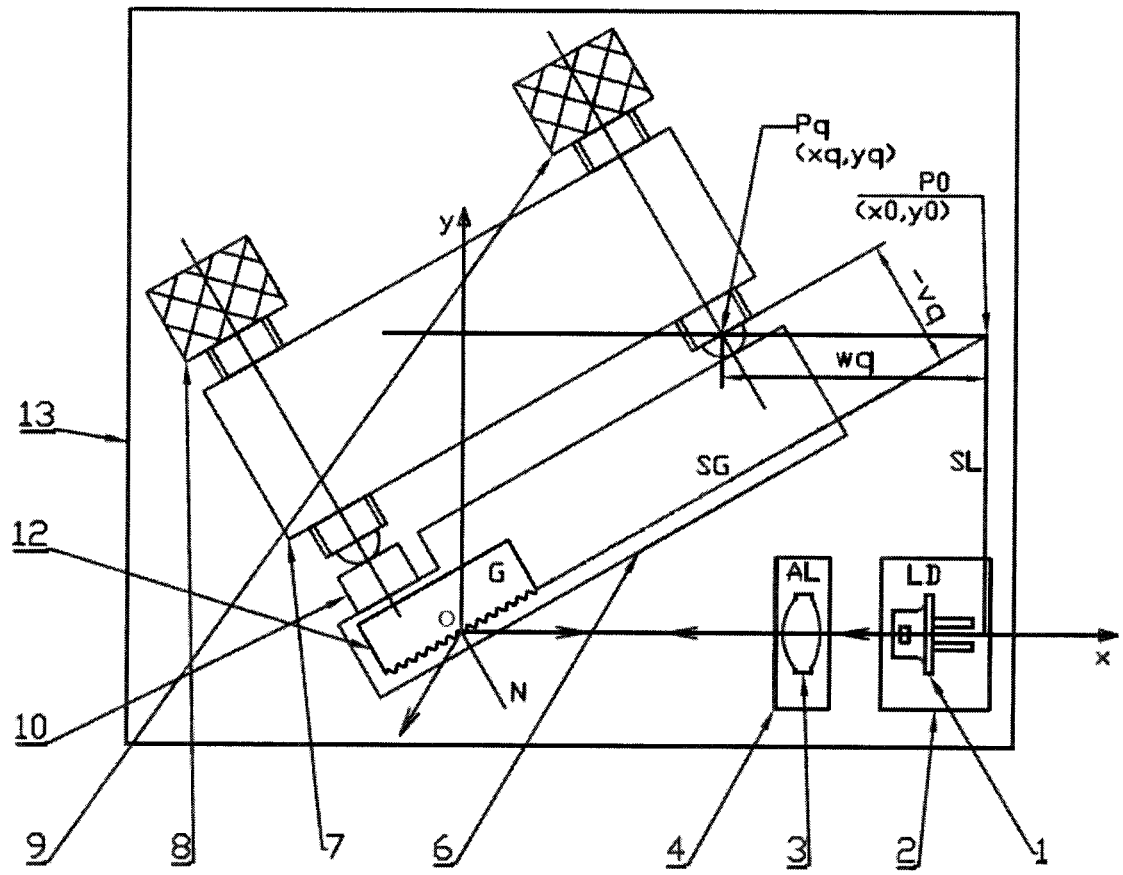
FIG. 16 shows the quasi-synchronous tuning mechanism of grating external-cavity semiconductor laser in Littrow configuration.

FIG. 16 is an illustration of a quasi-synchronous tuning external-cavity semiconductor laser in Littrow configuration, wherein $\theta i=\theta d=0$. As shown in FIG. 16, the first-order diffraction light of the grating G returns to the semiconductor diode LD along a path collinear with the original incident beam but in the opposite direction. In the quasi-synchronous tuning mechanism thereof, the grating G is fixed on an adjuster moving plate 6 which can be adjusted through adjusting screws 8 and 9 on an adjuster fixed plate 7. Laser wavelength tuning can be realized by rotating the diffraction grating G around a quasi-synchronous tuning rotation center Pq. For example, the angle of the light beam incident on the diffraction grating G can be changed by finely adjusting screw 8 and/or piezoelectric ceramics 10, and alignment adjustment of the quasi-synchronous tuning rotation center Pq and the grating G can be realized by adjusting screw 9.

It can be seen from FIG. 16 that, in the external-cavity semiconductor laser in Littrow configuration, quasi-synchronous tuning rotation centers Pq (xq,yq) lies on a line passing through the conventional synchronous tuning rotation center P0(x0, y0) and parallel to the x-axis.

Those skilled in the art will appreciated that, the semiconductor diode in the above examples may have other wavelength or output power, the grating can be a blazed grating or a transmission grating, which may have other groove density, size or thickness, the collimating lens may have other focal length and numerical aperture as well.

LIST OF THE REFERENCE SIGNS

1. Semiconductor Diode LD
2. Heat Sink
3. Collimating Lens AL
4. Lens Holder
5. Mirror M
6. Adjuster Moving Plate
7. Adjuster Fixed Plate
8. Adjusting Screw (for fine tuning)
9. Adjusting Screw
10. Piezoelectric Ceramics
11. Fixing Holder
12. Grating G
13. Base Plate

What is claimed is:

1. A grating external-cavity semiconductor laser in one of a Littman configuration or a grazing-diffraction configuration, comprising:
  a semiconductor laser diode;
  a grating;
  a mirror; and
  a quasi-synchronous tuning mechanism,
  wherein:
    the semiconductor laser diode, the grating, and the mirror are positioned such that:
      a first distance from a synchronous tuning point to a first plane on which a reflection surface of the mirror lies and a second distance from the synchronous tuning point to a second plane on which an equivalent rear facet of the semiconductor laser diode lies have a same absolute value and opposite signs; and
      the synchronous tuning point is located on a third plane on which a diffraction surface of the grating lies,
    the quasi-synchronous tuning mechanism includes:
      an adjuster fixed plate;
      an adjuster moving plate having a plate surface facing the adjuster fixed plate and having first and second ends, a rotating member being mounted on the first end, the rotating member including one of the grating or the mirror; and
      a plurality of adjusting screws on the adjuster fixed plate, the adjusting screws being configured to adjust a position of a rotation axis, at the second end of the adjuster moving plate and being parallel to the plate surface, to coincide with a quasi-synchronous tuning point located apart from the third plane, and rotate the first end about the rotation axis, so as to rotate the rotating member about the quasi-synchronous tuning point, such that a distance between a plane on which a rotating member surface of the rotating member lies and the quasi-synchronous tuning point does not change during the rotation,
    wherein the quasi-synchronous tuning point is located apart from the synchronous tuning point in a direction that forms an angle with respect to a direction of the laser beam incident on the grating, the angle equaling one of (a) $\Delta\theta$ when the rotating member includes the mirror, or (b) $\Delta\theta/2$ when the rotating member includes the grating, and $\Delta\theta$ being an angle difference between an incidence angle of the laser beam on the grating and a diffraction angle of the laser beam on the grating.

2. The grating external-cavity semiconductor laser according to claim 1, wherein the quasi-synchronous tuning mechanism further comprises:
  a piezoelectric ceramic member on the adjuster moving plate, configured to fine-tune a rotational angle of the rotating member by applying a control voltage on the piezoelectric ceramic member.

* * * * *